United States Patent [19]

Eguchi

[11] Patent Number: 4,859,622
[45] Date of Patent: Aug. 22, 1989

[54] METHOD OF MAKING A TRENCH CAPACITOR FOR DRAM

[75] Inventor: Koji Eguchi, Hyogo, Japan

[73] Assignee: Matsubishi Denki Kabushiki Kaisha, Tokyo, Japan

[21] Appl. No.: 227,333

[22] Filed: Aug. 2, 1988

Related U.S. Application Data

[62] Division of Ser. No. 119,893, Nov. 12, 1987.

[30] Foreign Application Priority Data

Nov. 12, 1986 [JP] Japan .................. 61-269172

[51] Int. Cl.⁴ .......................................... H01L 21/93
[52] U.S. Cl. ........................... 437/47; 437/60; 437/52; 437/203; 437/228; 437/919; 437/249
[58] Field of Search .................. 437/47, 60, 203, 228, 437/919; 156/643, 644, 646; 351/23.6, 1; 148/DIG. 50

[56] References Cited

U.S. PATENT DOCUMENTS

3,962,713  6/1976  Kendall et al. ................ 357/55
4,650,544  3/1987  Erb et al. ....................... 156/653
4,688,064  8/1987  Ogura et al. ................... 357/23.6

FOREIGN PATENT DOCUMENTS

0159824   3/1985  European Pat. Off. .
0186875   7/1986  European Pat. Off. .
0141262   8/1984  Japan .
60-239053 11/1985  Japan .

*Primary Examiner*—Brian E. Hearn
*Assistant Examiner*—Tom Thomas
*Attorney, Agent, or Firm*—Lowe, Price, LeBlanc, Becker & Shur

[57] ABSTRACT

Two or three trenches are formed in a silicon substrate, and a conductive layer is formed in the silicon substrate facing the trenches. An oxide film for insulation is formed on a surface of the conductive layer facing the trenches. The trenches are filled with polysilicon, and the conductive layer and the polysilicon constitute a capacitor through the oxide film. Since this capacitor has two or three trenches, an effective area sufficiently large for increasing a capacitance value of the capacitor can be obtained without increasing the plane area of the device. The conductive layer and the polysilicon are connected to aluminum interconnection layers through a silicide layer, so as to be connected to other integrated circuits.

17 Claims, 7 Drawing Sheets

METHOD OF MAKING A TRENCH CAPACITOR FOR DRAM

This is a division of application Ser. No. 119,893, filed 11/12/87.

BACKGROUND OF THE INVENTION

1. Field of the Invention

The present invention relates to a capacitance element for a semiconductor device and a method of manufacturing the same.

2. Description of the Prior Art

As a megabit VLSI dynamic memory or the like is implemented with a larger scale of integration, each of capacitance elements employed therein must be reduced in occupied area. However, such a capacitance element being simply reduced in occupied area cannot withstand external noise (particularly soft error caused by alpha rays), and hence it is impossible to unrestrictedly reduce the occupied area of the capacitance element.

Methods generally adopted to increase a capacitance value comprise a method of increasing an effective surface area where a capacitance is to be formed, and a method of inserting a material having a high dielectric constant between two surfaces forming a capacitance. The former method is considerably effective but involves an incompatible problem not easily solved by a simple increase of the effective area because reduction of an area occupied by a capacitance is required in a dynamic memory as described above. In the latter method, $Ta_2O_5$ for example is used as a material having a high dielectric constant but such a material as $Ta_2O_5$ is liable to cause dielectric breakdown. Consequently, the latter method is not suited either.

Therefore, the so-called trench type capacitance element, provided in a trench formed in a substrate to be reduced in occupied area on the substrate, has been generally employed as a capacitance element for a memory device such as a dynamic RAM.

Figure 1:
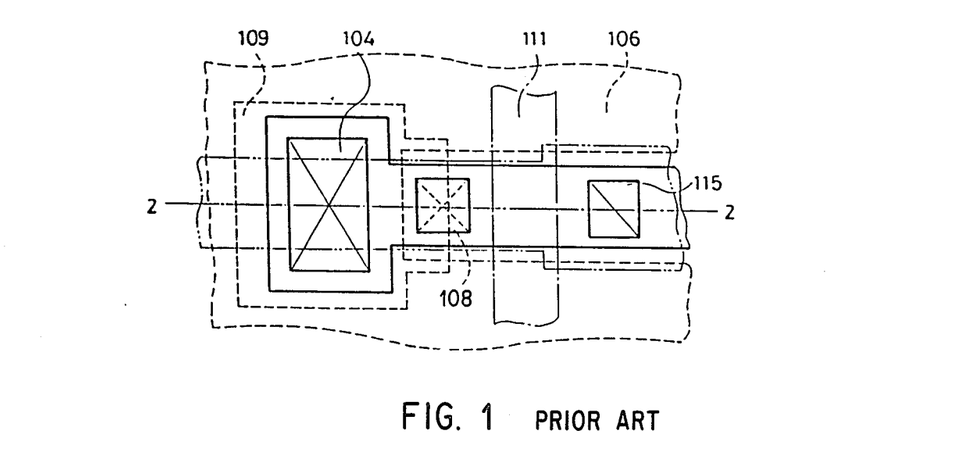
FIGS. 1 and 2 are a plan view and a sectional view, respectively, showing a structure of a memory cell of a conventional dynamic RAM.
Figure 2:
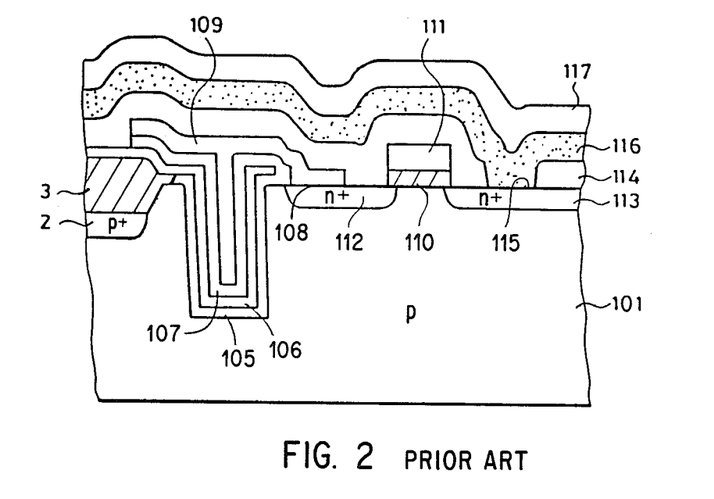

FIGS. 1 and 2 are a plan view and a sectional view, respectively, showing a structure of a memory cell of a conventional MIS (metal insulator semiconductor) dynamic RAM disclosed in Japanese Patent Laying-Open Gazette No. 239053/1985.

This memory cell comprises: a silicon substrate 101; a p+ diffusion layer 102; an oxide film 103; a groove 104 for forming a capacitor; an oxide film 105 outermost from the groove 104; a first polysilicon layer 106 inside the oxide film 105 to form the capacitor; a nitride film 107 formed inside the first polysilicon layer 106 for insulation of two poles of the capacitor; a contact 108; a second polysilicon layer 109 for forming the capacitor; a gate oxide film 110; a gate 111; n+ diffusion layers 112 and 113; an insulating film 114; a contact 115; a bit line 116; and a protection film 117. This memory cell of the dynamic RAM uses a trench type capacitance element.

Figure 3:
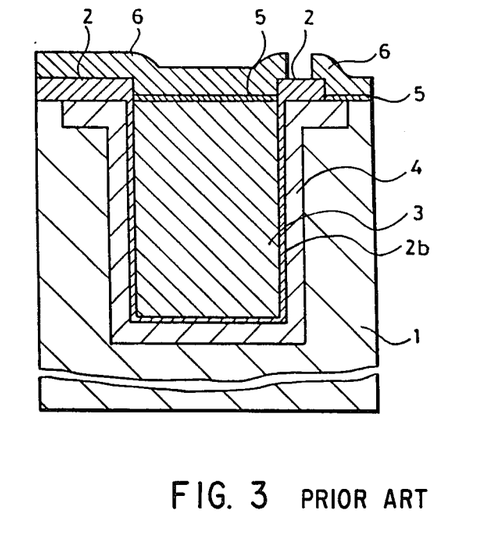
FIG. 3 is a sectional view showing a structure of a conventional trench type capacitance element.

FIG. 3 is a sectional view showing a trench type capacitance element of another conventional memory cell. The memory cell shown in FIG. 3 comprises a semiconductor substrate 1, an insulating film 2 such as an oxide film, a polysilicon layer 3, a conductive layer 4, a silicide layer 5 formed by barrier metal and an aluminum interconnection layer 6.

Conventional trench forms are roughly classified into two types. The first type is shown by a mask pattern in FIG. 4A in which the hatched portion is formed as a trench. The second type is shown by a mask pattern in FIG. 5A in which the hatched portion is formed as a trench. In order to more clearly indicate the forms of the trenches of those two types, a form of a conductive layer 4 in a lower portion of each trench will be described in the following.

Figure 4A:
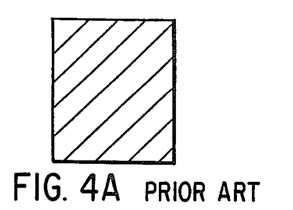
FIG. 4A shows an example of a mask pattern for forming a conventional trench type capacitance element.
Figure 4B:
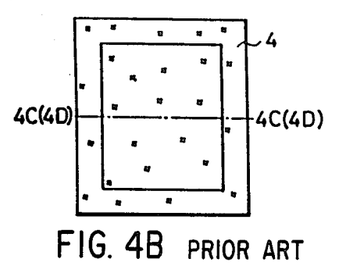
FIGS. 4B, 4C and 4D are a plan view, a sectional view and a perspective view, respectively, of a conductive layer of a trench for explaining a form of the trench formed by using the mask pattern shown in FIG. 4A.
Figure 4C:
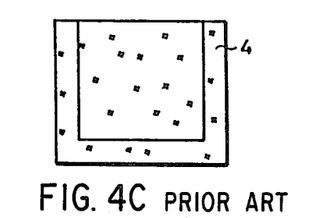
Figure 4D:
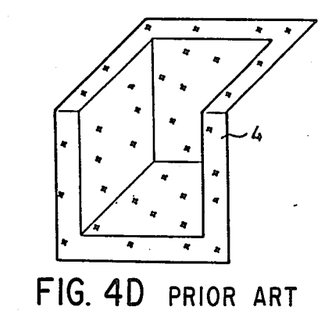

FIG. 4B is a plan view of the conductive layer 4 of the trench formed by using the mask pattern shown in FIG. 4A; FIG. 4C is a sectional view taken along the line 4C—4C in FIG. 4B; and FIG. 4D is a perspective view of this conductive layer 4.

Figure 5A:
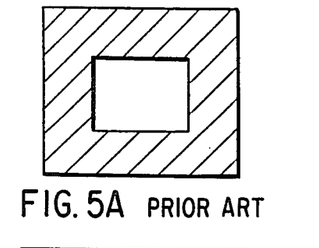
FIG. 5A shows another example of a mask pattern for forming a conventional trench type capacitance element.
Figure 5B:
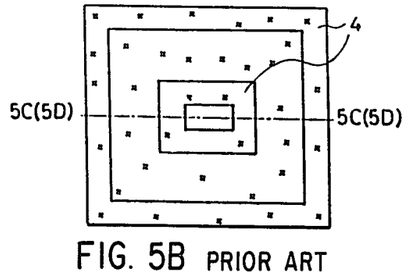
FIGS. 5B, 5C and 5D are a plan view, a sectional view and a perspective view, respectively, of a conductive layer of a trench for explaining a form of the trench formed by using the mask pattern shown in FIG. 5A.
Figure 5C:
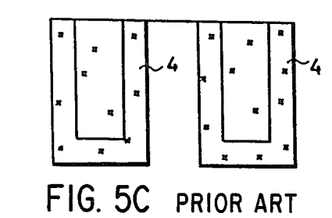
Figure 5D:
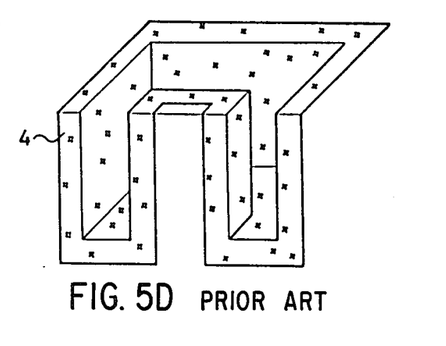

FIG. 5B is a plan view of the conductive layer 4 of the trench formed by using the mask pattern shown in FIG. 5A; FIG. 5C is a sectional view taken along the line 5C—5C in FIG. 5D; and FIG. 5D is a perspective view of this conductive layer.

Thus, the two types of trenches are conventionally used and in either case, a single trench is formed.

Although such a trench type capacitance element has a small opening area, an advantage is brought about that the capacitance component obtained by the same is substantially identical to that of a non-trench type capacitance element.

However, the trench must be extremely deeply provided in the conventional trench type capacitance element. The depth of such a trench needs to be further increased if an opening area of an element is reduced without decreasing a capacitance value thereof in view of improvement in a scale of integration of a memory device. In order to cope with this, it is necessary to provide a dielectric film of high withstand voltage along the side wall of the trench, whereas it is extremely difficult in technique to form such a film. Thus, it has been substantially impossible to unrestrictedly reduce the opening area of the trench type capacitance element by increasing the depth of the trench in view of improvement in a scale of integration.

Under the circumstances, the U.S. Pat. No. 3,962,713 issued on June 8, 1976 to D. L. Kendail et al. entitled "Large Value Capacitor" proposes a solution of the above described problems, in which an effective surface area is increased by providing an increased number of trenches, i.e. more than one. However, according to this proposal, the trenches are formed by simply applying a conventional photolithographic etching process and consequently a spacing of the adjacent trenches or a width of each trench is limited to a value permissible for etching by the photolithographic process. As a result, a trench narrower than a width of a mask for etching cannot be formed, which imposes restrictions on improvement of a scale of integration and increase of a capacitance value.

SUMMARY OF THE INVENTION

The present invention has been accomplished to overcome the aforementioned disadvantages of the prior art.

Therefore, it is an object of the present invention to provide a semiconductor device and a method of manufacturing thereof, which makes it possible to increase a capacitance value of a trench type capacitance element to a value a few times larger than that of a conventional trench type capacitance element without increasing an opening area and a depth of each trench in the capacitance element.

Briefly stated, the present invention includes: a plurality of trenches adjacent to one another and extending into a semiconductor substrate from a major surface thereof, upper interconnection wall being provided with a spacing from the major surface of the semiconductor substrate to interconnect the immediately adjacent ones of the trenches; and a conductive material filling the trenches and a region between the upper interconnection wall and the major surface of the semiconductor substrate.

According to the present invention, the conductive material filling the trenches and the region between the upper interconnection wall and the major surface of the semiconductor substrate constitutes an element of a capacitor. Therefore, this element can be utilized for a trench type capacitance element for integrated circuit.

A preferred embodiment of the present invention further comprises an insulating layer formed on the surfaces of the plurality of trenches and a conductive layer formed in the semiconductor substrate to be in contact with the insulating layer, and the conductive layer and the conductive material filling the trenches and the region between the upper interconnection wall and the main surface of the semiconductor substrate constitute a capacitor through the insulating layer formed on the surfaces of the trenches.

According to the preferred embodiment of the present invention, the capacitor is of a structure of a plurality of trenches and thus an effective area necessary for increasing a capacitance value of the capacitor can be enlarged without increasing the depth of the trenches.

Consequently, an advantage is brought about that a capacitance value of the capacitor formed in the integrated circuit can be increased by a conventional technique for forming trenches without using a trench deepening technique which involves technical difficulties as described above.

According to another aspect, the present invention comprises the steps of forming a concavity of a first depth in a major surface of a semiconductor substrate; forming a first insulating film on the major surface excluding the concavity and major surface region adjacent thereto within a prescribed distance being exposed; forming a second insulating film on the semiconductor substrate including the concavity and on the first insulating film; anisotropically etching the second insulating film to leave the first insulating film and second insulating film portion on side walls of a first step portion formed by the bottom surface of the concavity and the major surface of the semiconductor substrate and on side walls of a second step portion formed by the major surface of the semiconductor substrate and the first insulating film, the other second insulating film portions being removed, with regions of the bottom surface of the concavity and the major surface of the semiconductor substrate adjacent to the left second insulating film portion being exposed; and anisotropically etching to a second depth the exposed regions of the bottom surface of the concavity and the main surface of the semiconductor substrate by using the left first insulating film and the left second insulating film portion as a mask, whereby more than one trench are formed.

According to the above described aspect of the present invention, the second insulating film having a prescribed thickness is formed on the semiconductor substrate including the concavity and the first insulating film along the horizontal and vertical directions. Thus, the second insulating film having the prescribed thickness is provided on the side walls of the first and second step portions in the same manner as that on the horizontal surfaces of the semiconductor substrate and the first insulating film. Accordingly, the second insulating film formed on each of the side walls of the first and second step portions has a thickness exceeding the prescribed thickness viewed in the vertical direction. When anisotropic etching is applied to the second insulating film to remove portions thereof by the prescribed thickness in the vertical direction, a second insulating film portion is left only on the side walls of the first and second step portions, with the other second insulating film portions being removed, whereby portion of the bottom surface of the concavity and the major surface of the semiconductor substrate, adjacent to the remaining second insulating film portion, are exposed. After that, the exposed portions are anisotropically etched by using the left second insulating film portion and the first insulating film as a mask, whereby more than one trench are formed. Thus, the trenches having a narrow width and close to one another can be obtained.

Consequently, the above described aspect of the invention has an advantage that more than one trench having a narrow width and close to one another can be formed in a substrate having the same plane area as in a conventional device by using a mask pattern having the same size as that of a conventional one.

A further preferred embodiment in the above described aspect of the present invention further comprises the steps of: removing the left second insulating film portion and the first insulating film and doping impurity into a region of the semiconductor substrate facing the trenches to cause this region to be a conductive layer; forming a third insulating film on a surface of the conductive layer facing the trenches; and filling a conductive material in the trenches to electrically couple the filled conductive material.

In the further preferred embodiment in the above described aspect of the invention, the conductive layer formed in the semiconductor substrate and the electrically coupled conductive material in the trenches constitute a capacitor through the third insulating film.

The above described further preferred embodiment in the aspect of the invention makes it possible to obtain a capacitor formed by utilizing more than one narrow trench in a substrate having the same plane area as that of a conventional device and accordingly an advantage is brought about that a capacitance value of the capacitor can be made a few times larger than that of a conventional capacitor without increasing the plane area of the substrate or the depth of the trenches and without requiring any additional technical steps.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Description is now made of an embodiment of the present invention.

Figure 6:
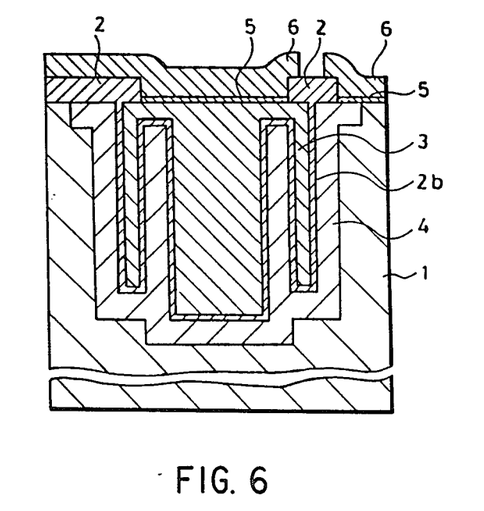
FIG. 6 is a sectional view showing a structure of a trench type capacitance element in an embodiment of the present invention.
Figure 7A:
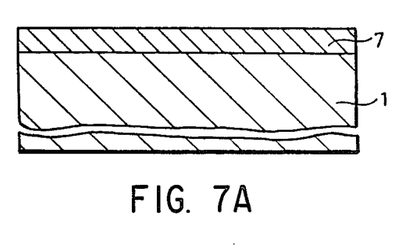
FIGS. 7A to 7R are sectional views showing steps of manufacturing a trench type capacitance element of an embodiment of the present invention.
Figure 7B:
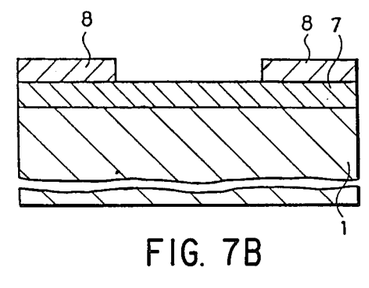
Figure 7C:
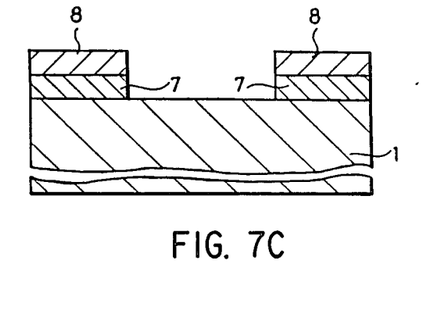
Figure 7D:
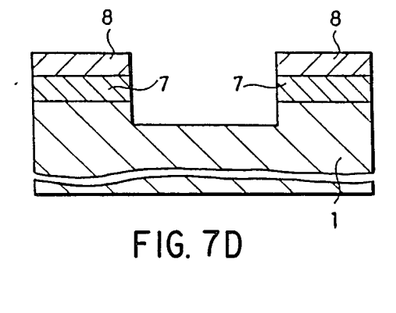
Figure 7E:
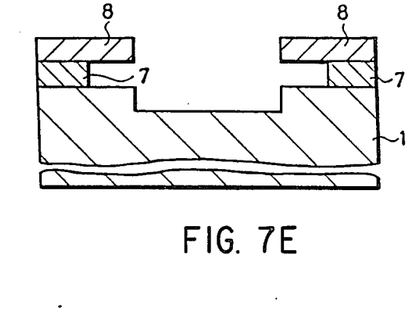
Figure 7F:
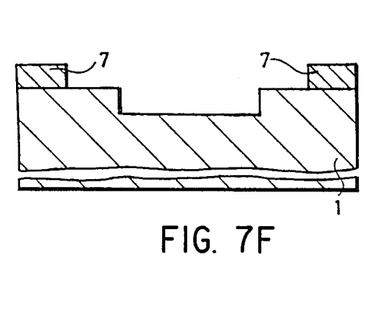
Figure 7G:
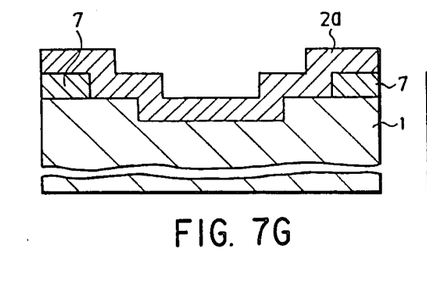
Figure 7H:
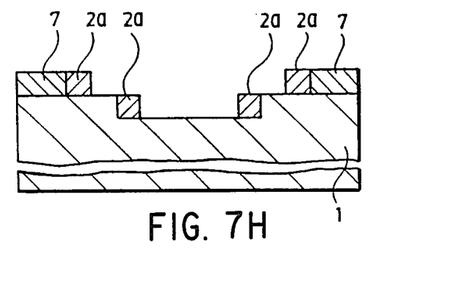
Figure 7I:
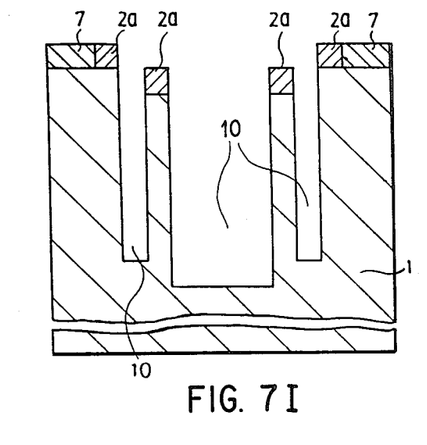
Figure 7J:
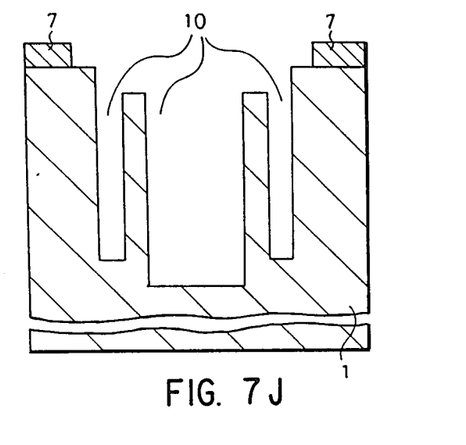
Figure 7K:
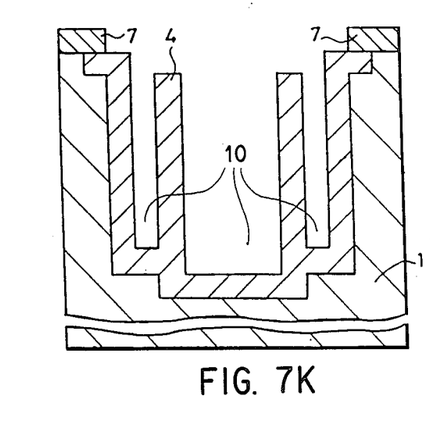
Figure 7L:
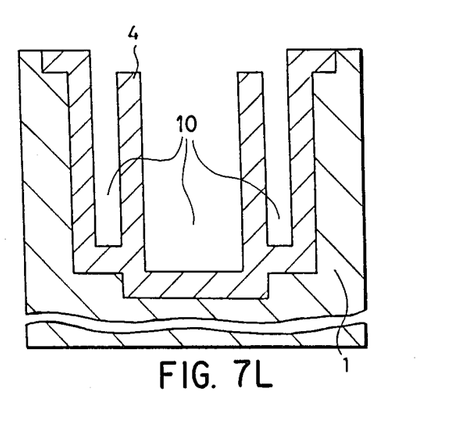
Figure 7M:
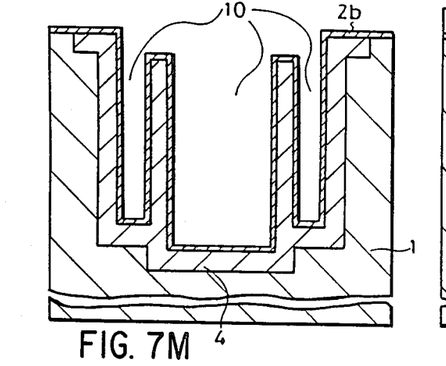
Figure 7N:
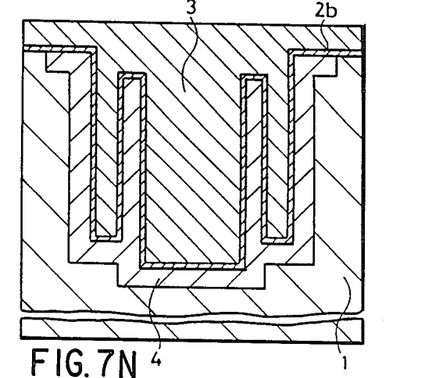
Figure 7O:
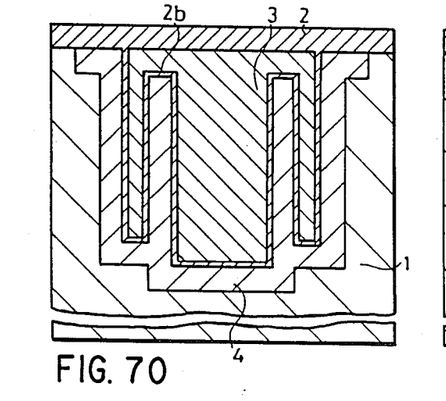
Figure 7P:
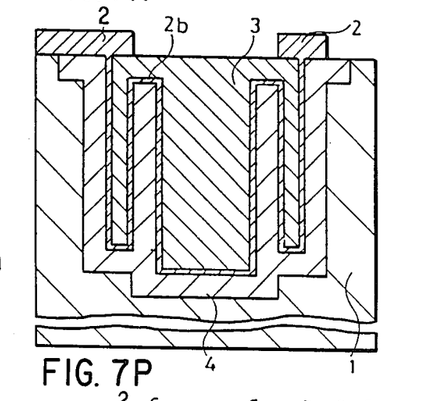
Figure 7Q:
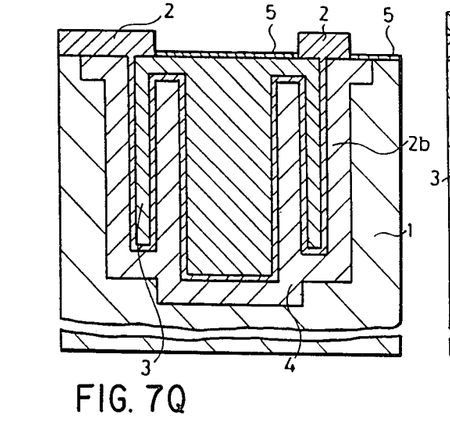
Figure 7R:
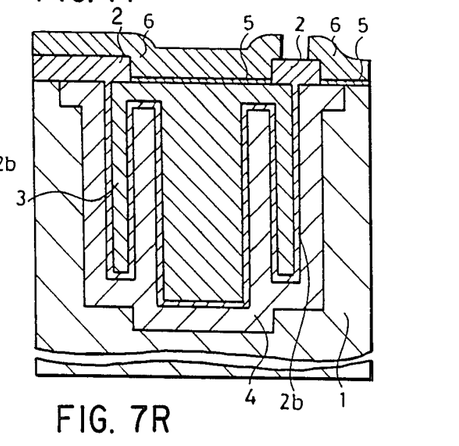

FIG. 6 is a sectional view showing a semiconductor device of the embodiment and FIGS. 7A through 7R illustrate a process of manufacturing the semiconductor device. The semiconductor device of the embodiment comprises a substrate 1, an oxide film 2, second and third insulating films 2a and 2b, respectively, such as oxide films, a polysilicon layer 3, a conductive layer 4, a silicide layer 5, an interconnection layer 6 such as an aluminum interconnection layer, a first insulating film 7 such as a nitride film, and resist films 8.

Description is now made of the process of manufacturing the semiconductor device with reference to FIGS. 7A to 7R.

Referring to FIG. 7A, the first insulating film 7, such as a nitride film, is deposited on the substrate 1. Then the resist films 8 are formed as patterned on arbitrary positions by photolithography, as shown in FIG. 7B. Thereafter the nitride film 7 is vertically anisotropically etched through masks of the resist films 8 to define an opening, as shown in FIG. 7C. Then the substrate 1 is vertically anisotropically etched through masks of the resist films 8 and the nitride film 7 to define an opening, as shown in FIG. 7D. Thereafter the nitride film 7 is isotropically etched to increase the size of the opening in the nitride film 7 as shown in FIG. 7E. Then the resist films 8 are removed as shown in FIG. 7F.

The second insulating film 2a such as an oxide film is formed over the entire surface, as shown in FIG. 7G, and then the oxide film 2a is anisotropically etched to be left only in portions on stepped side wall parts of the nitride film 7 and the substrate 1. In this state, the substrate surface part exposed in the step of isotropic etching of the nitride film 7 and the substrate surface part forming the bottom of the opening exposed in the step of anisotropic etching of the substrate 1 are not covered by the oxide film 2a.

Thereafter the substrate 1 is anisotropically etched through masks of the nitride film 7 and the oxide film 2 to form trenches having prescribed depths as shown in FIG. 7I. Since the oxide film 2a is left in four portions in the preceding step, three trenches are formed per element, dissimilarly to the conventional trench type capacitance element.

Thereafter the oxide film 2a is removed as shown in FIG. 7J, and the conductive layer 4 is formed by doping impurity as shown in FIG. 7K. Such doping impurity may be performed by solid diffusion, ion implantation (diagonal ion implantation) or diffusion with a diffusion source of liquid glass doped with impurity.

Then the nitride film 7 is removed as shown in FIG. 7L, and the third insulating film 2b is formed as a dielectric film of the capacitance element as shown in FIG. 7M. While the third insulating film 2b may be formed by a material different from the first and second insulating films 7 and 2a, i.e., a dielectric substance other than nitride and oxide films, the same is prepared by an oxide film similarly to the second insulating film 2a in this embodiment, to be easily formed as a stable film. Then polysilicon is filled in the trenches 10 and flatly stacked to provide the polysilicon layer 3 as shown in FIG. 7N, and the surface thereof is oxidized to form the oxide film 2 as shown in FIG. 7O.

Thereafter the oxide film 2 is etched through photolithographic patterning in order to provide electrodes of the capacitance element in the polysilicon layer 3 and the conductive layer 4, as shown in FIG. 7P. Then a barrier metal layer is provided to prevent alloy spikes against the substrate 1 and the polysilicon layer 3 as well as to make ohmic contact, and the same is subjected to heat treatment to form the silicide layer 5 as shown in FIG. 7Q. Then the interconnection layer 6 is provided to complete the trench type capacitance element as shown in FIG. 7R.

Thus, the present invention directly employs the conventional technique, i.e., self-alignment technique and etching technique (combination of isotropic and anisotropic etching processes and utilization of difference in etching rate), whereby no specific mechanism is required to be newly introduced as a manufacturing apparatus and no difficult technical steps are additionally required. Thus, semiconductor devices of high performance and reliability suited for VLSI can be obtained in the same size and on the same design basis with large capacitance, compared with the conventional devices.

Although the first insulating film is formed by a nitride film and the second and third insulating films are formed by oxide films in the aforementioned embodiment, the same may be prepared by other films of $Al_2O_3$ or SiON etc., so far as similar effects can be obtained.

The silicide layer 5 may be formed by any of TiSi, WSi, PtSi, MoSi and the like.

Concrete examples of trenches formed according to the present invention are described in the following.

Figure 8A:
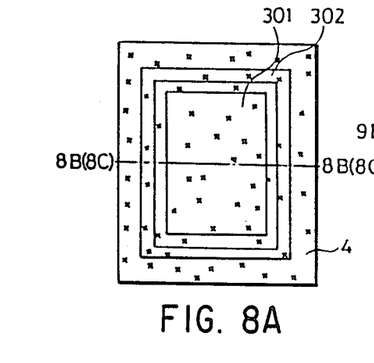
FIGS. 8A, 8B and 8C are a plan view, a sectional view and a perspective view, respectively, of a conductive layer of trenches manufactured in accordance with the present invention, illustarating an example of the trenches.
Figure 8B:
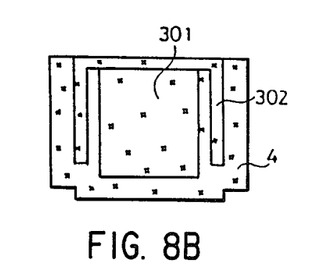
Figure 8C:
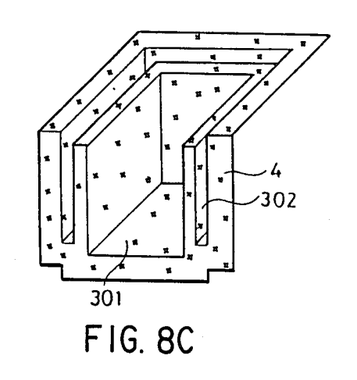

FIG. 8A is a plan view showing the conductive layer 4 and the trenches in a lower portion of a device manufactured according to the present invention, corresponding to the case using the mask pattern shown in FIG. 4A. FIG. 8B is a sectional view taken along the line 8B—8B in FIG. 8A, and FIG. 8C is a perspective view of the portion shown in FIG. 8B. As shown in those figures, two trenches, i.e. the first trench 301 and the second trench 302 surrounding the first trench 301 are formed.

Figure 9A:
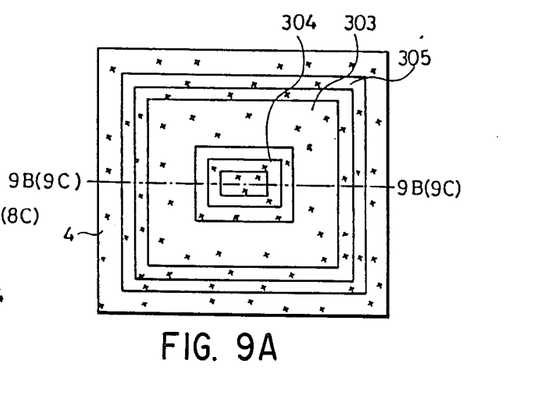
FIGS. 9A, 9B and 9C are a plan view, a sectional view and a perspective view, respectively, of a conductive layer of trenches manufactured in accordance with the present invention, illustrating another example of the trenches.
Figure 9B:
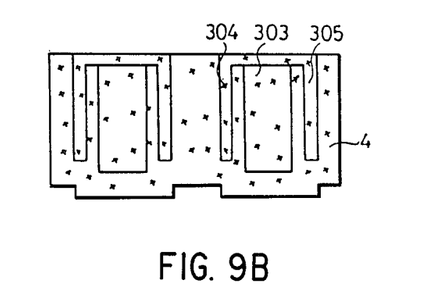
Figure 9C:
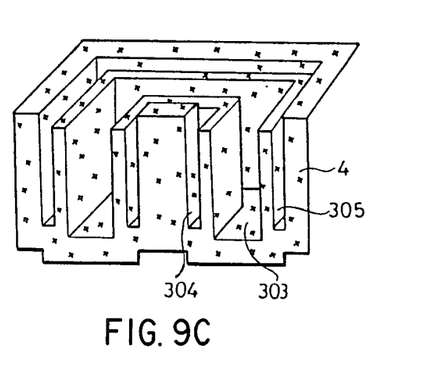

FIG. 9A is a plan view showing the conductive layer 4' and the trenches in a lower portion of a device manufactured according to the present invention, corresponding to the case using the mask pattern shown in FIG. 5A. FIG. 9B is a sectional view thereof taken along the line 9B—9B in FIG. 9A, and FIG. 9C is a perspective view thereof. This example in FIGS. 9A to 9C includes three trenches, i.e. the first trench 303, the second trench 304 inside the first trench 303, and the third trench 305 outside the first trench 303.

It is pointed out that the sectional views shown in FIGS. 7A to 7R referred to in describing the manufacturing process of the inventive semiconductor devices correspond to the sectional views shown in FIG. 8B or either the left or right half of the sectional views shown in FIG. 9B.

Although the plane figures of the trenches shown in FIGS. 8A and 9A are rectangular, other forms such as any polygon or a circle may be adopted as the plane figures of the trenches.

According to the present invention as hereinabove described, insulating films are formed in arbitrary portions on the semiconductor substrate in a self-alignment manner to form two or three trenches for a trench type capacitance element on the substrate through masks of the insulating films, whereby the capacitance of the semiconductor device can be improved by two or three times without increasing the occupied area of the trench type capacitance element on the substrate and the depth of the trenches therefor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:
    providing a semiconductor substrate having a major surface including a concavity of a first depth from said major surface,
    forming a first insulating film on edge region of said major surface of said semiconductor substrate with said concavity and region of said major surface close to said concavity within a prescribed distance being exposed,
    a first step portion being formed by a difference in level between a bottom of said concavity and said major surface of said semiconductor substrate, and a second step portion being formed by a difference in level between said major surface of said semiconductor substrate and an upper surface of said first insulating film,
    forming a second insulating film on said semiconductor substrate including concavity and on said first insulating film,
    anisotropically etching said second insulating film to leave said first insulating film and a portion of said second insulating film on side walls of said first and second step portions, and to expose regions of the bottom of said concavity and said major surface of said semiconductor substrate contiguous to the left portions of said second insulating film, and
    anisotropically etching said exposed region of the bottom of said concavity and said exposed region of the major surface of said semiconductor substrate to a second depth larger than said first depth by using the left first insulating film and the left portion of said second insulating film as a mask, to form more than one trench, an upper wall interconnecting immediately adjacent ones of said trenches being spaced from said major surface of said semiconductor substrate by a prescribed distance.

2. A method of manufacturing a semiconductor substrate in accordance with claim 1, further comprising the step of removing the left portion of said second insulating film and said first insulating film and doping an impurity into a region of said semiconductor substrate facing said trenches to cause said region to be a conductive layer.

3. A method of manufacturing a semiconductor device in accordance with claim 2, further comprising the step of forming a third insulating film on a surface of said conductive layer facing said trenches.

4. A method of manufacturing a semiconductor device in accordance with claim 3, further comprising the step of filling said trenches with a conductive material and electrically coupling said conductive material.

5. A method of manufacturing a semiconductor device in accordance with claim 4, further comprising the step of forming electrodes electrically connected to said conductive layer and said coupled conductive material, respectively, and forming interconnection layers connected to said electrodes.

6. A method of manufacturing a semiconductor device in accordance with claim 1, wherein said step of providing the semiconductor substrate including the concavity comprises the steps of:
    forming the first insulating film on said semiconductor substrate and forming a patterned resist for etching on said first insulating film, and
    anisotropically etching said first insulating film using said resist as a mask and anisotropically etching said substrate to the first depth.

7. A method of manufacturing a semiconductor device in accordance with claim 1, wherein said step of forming said first insulating film on the edge region of said major surface comprises the steps of:
    partially etching said first insulating film under said resist through isotropic etching using said resist as a mask, and
    removing said resist.

8. A method of manufacturing a semiconductor device in accordance with claim 2, wherein said step of causing the region of said semiconductor substrate facing said trenches to be the conductive layer comprises the steps of:
    removing all of the left portion of said second insulating film,
    doping an impurity into the region of said semiconductor substrate facing said trenches by using said first insulating film as a mask to cause said region to be said conductive layer, and
    removing said first insulating film.

9. A method of manufacturing a semiconductor device in accordance with claim 5, wherein said step of forming said electrodes and said interconnection layers comprises the steps of:
    forming a fourth insulating film on said conductive layer, said coupled conductive material and said major surface of said semiconductor substrate through etching to partially expose upper surfaces of said conductive layer and said coupled conductive material,
    forming barrier metals on said exposed upper surfaces of said conductive layer and said coupled conductive material and applying heat treatment to said barrier metals to form silicide layers, and forming interconnection layers of aluminum connected to said silicide layers.

10. A method of manufacturing a semiconductor device in accordance with claim 9, wherein said step of forming the fourth insulating film comprises the step of forming said fourth insulating film on said conductive layer, said coupled conductive material and said major surface of said semiconductor substrate, and patterning and etching said fourth insulating film.

11. A method of manufacturing a semiconductor device in accordance with claim 2, wherein said step of doping an impurity to form the conductive layer comprises the step of diffusing the impurity.

12. A method of manufacturing a semiconductor device in accordance with claim 2, wherein said step of doping an impurity to form the conductive layer comprises the step of applying ion implantation.

13. A method of manufacturing a semiconductor device in accordance with claim 11, wherein said step of diffusing an impurity comprises the step of diffusing the impurity by using doped liquid glass as a diffusion source.

14. A method of manufacturing a semiconductor device in accordance with claim 9, wherein said first, second, third and fourth insulating films are any of an oxide film, a nitride film, an oxide nitride film and an aluminum dioxide film.

15. A method of manufacturing a semiconductor device in accordance with claim 4, wherein said conductive material is polysilicon.

16. A method of manufacturing a semiconductor device in accordance with claim 9, wherein said silicide layer is any of TiSi, WSi, PtSi and MoSi.

17. A method of manufacturing a semiconductor device in accordance with claim 1, wherein said prescribed distance is set to a value exceeding a thickness of said second insulating film.

* * * * *